(12) United States Patent
Nojima (10) Patent No.: US 8,158,502 B2
(45) Date of Patent: Apr. 17, 2012

(54) METHOD OF MANUFACTURING A SEMICONDUCTOR DEVICE INCLUDING A SILICON PILLAR

(75) Inventor: Kazuhiro Nojima, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 71 days.

(21) Appl. No.: 12/633,332

(22) Filed: Dec. 8, 2009

(65) Prior Publication Data

US 2010/0140671 A1     Jun. 10, 2010

(30) Foreign Application Priority Data

Dec. 9, 2008   (JP) ................................. 2008-313363

(51) Int. Cl.
   *H01L 21/3205*   (2006.01)
(52) U.S. Cl. ........ 438/591; 438/238; 438/239; 438/386; 438/587; 257/E21.21
(58) Field of Classification Search .......... 438/238–239, 438/386, 399
See application file for complete search history.

(56) References Cited

U.S. PATENT DOCUMENTS 7,358,551 B2 * 4/2008 Chidambarrao et al. ...... 257/288
2005/0280113 A1 * 12/2005 Kim et al. ..................... 257/501

FOREIGN PATENT DOCUMENTS

| JP | 2004-349291 A | 12/2004 |
| JP | 2005-311251 A | 11/2005 |
| JP | 2008-177573 A | 7/2008 |

* cited by examiner

*Primary Examiner* — Thanh Nguyen (74) *Attorney, Agent, or Firm* — Sughrue Mion, PLLC (57) ABSTRACT

A method of manufacturing a semiconductor device includes forming silicon pillar 11 on substrate 10, forming a protective film which covers an upper end portion and a lower end portion of a side surface of silicon pillar 11, forming a constricted portion by anisotropic etching in a portion of the side surface of silicon pillar 11 which is not covered with the protective film after forming the protective film, removing the protective film after forming the constricted portion, forming gate oxide film 12 which covers the side surface of silicon pillar 11 in which the constricted portion is formed, and forming gate electrode 13 which covers gate oxide film 12.

3 Claims, 14 Drawing Sheets

91 constricted portion

{100} plane

{111} plane

METHOD OF MANUFACTURING A SEMICONDUCTOR DEVICE INCLUDING A SILICON PILLAR

This application is based upon and claims the benefit of priority from Japanese Patent Application No. 2008-313363 filed on Dec. 9, 2008, the content of which is incorporated by reference.

BACKGROUND OF THE INVENTION

1. Field of the Invention

The present invention relates to a semiconductor device comprising a silicon pillar formed on a substrate and to a method of manufacturing the semiconductor device.

2. Description of Related Art

With respect to semiconductor memories as one kind of semiconductor device, there has been a demand for reducing the chip area year by year for the purpose of achieving a low cost. To meet this demand, $4F^2$ ($2F\times2F$) cell structures have been proposed for dynamic random access memories (DRAMs) which is one kind of semiconductor memory. "$4F^2$" means the area of a memory cell which comprises of one transistor and one capacitor, and "F" means the minimum feature size.

Figure 1:
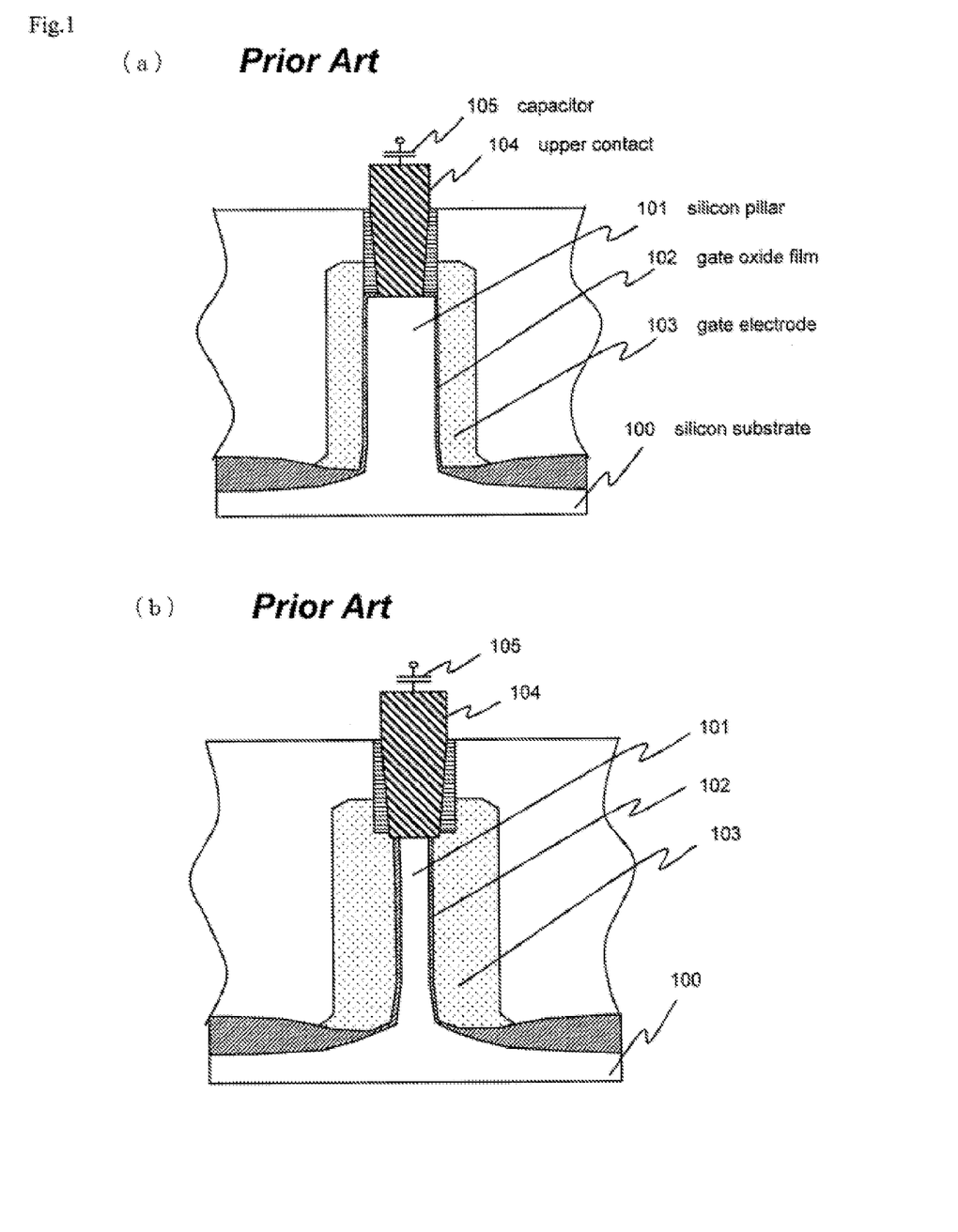
FIGS. 1(a) and 1(b) are sectional views showing an example of the structure of a transistor constituting a $4F^2$ cell structure.

In the $4F^2$ cell structures, a capacitor and a transistor which are included in a memory cell are vertically stacked. FIGS. 1(a) and 1(b) are sectional views showing an example of the structure of a transistor constituting a memory cell of a $4F^2$ cell structure. The transistor shown in FIG. 1(a) has silicon pillar 101 formed on silicon substrate 100 by etching. A side surface of silicon pillar 101 is covered with gate electrode 103 via gate oxide film 102. When a voltage is applied to gate electrode 103, a channel is produced in silicon pillar 101, and a longitudinal (vertical) current path is formed from silicon pillar 101 to capacitor 105 through upper contact 104.

If the diameter of silicon pillar 101 in the transistor shown in FIG. 1(a) is reduced (silicon pillar 101 is made thinner) as shown in FIG. 1(b), the electron mobility increases with the reduction in density of states of places to which electrons are scattered and, therefore, the transistor can operate at a higher speed. Also, as a result of the reduced size of junction area, the probability of crystal defects contained in silicon pillar 101 is largely reduced and, therefore, the leak current is limited. As a result, the occurrence of minority bits in the DRAM is limited.

However, if silicon pillar 101 is excessively thin, the area of contact with upper contact 104 is so small that it is difficult to establish a low-resistance contact between silicon pillar 101 and upper contact 104. A transistor manufacturing method devised to solve such a problem has been proposed and disclosed in Japanese Patent Laid-Open No. 2008-177573.

In the method disclosed in Japanese Patent Laid-Open No. 2008-177573, a recess is formed in a central portion of a side surface of a silicon pillar by isotropic etching. That is, the silicon pillar has a shape such that only its central portion is made thin. In this way, the silicon pillar can be made thin without reducing the contact area at the top of the silicon pillar.

In the method disclosed in Japanese Patent Laid-Open No. 2008-177573, however, various crystal planes of the silicon crystal are exposed in the side surface of the silicon pillar after isotropic etching has been performed, because the silicon pillar is made thin by isotropic etching. When gate oxide film is formed in such a condition, variation in film thickness occurs due to a plane-direction dependence of the oxidation rate. From this, variations in the characteristics of the transistor (e.g., the threshold voltage and the leak current) can occur. There is, therefore, a possibility that the uniformity of the characteristics of the transistor will be impaired.

SUMMARY

The present invention seeks to solve one or more of the above problems, or to improve upon those problems at least in part.

In one embodiment, there is provided a method of manufacturing a semiconductor device that includes forming a silicon pillar on a substrate; forming a protective film covering an upper end portion and a lower end portion of a side surface of the silicon pillar; forming a constricted portion by anisotropic etching in a portion of the side surface of the silicon pillar not covered with the protective film, after forming the protective film; removing the protective film after forming the constricted portion; forming a gate oxide film covering the side surface of the silicon pillar in which the constricted portion is formed, after removing the protective film; and forming a gate electrode covering the gate oxide film.

According to the method, a constricted portion is formed in the side surface of the silicon pillar by anisotropic etching, so that a particular crystal plane is dominant in the side surface of the silicon pillar. That is, the gate oxide film can be formed in a condition in which the particular crystal plane is exposed in the side surface of the silicon pillar lager than other crystal planes. In this way, variation in thickness of the gate oxide film can be limited. Therefore, the silicon pillar can be made thin without impairing the uniformity of the characteristics of the transistor.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Figure 2:
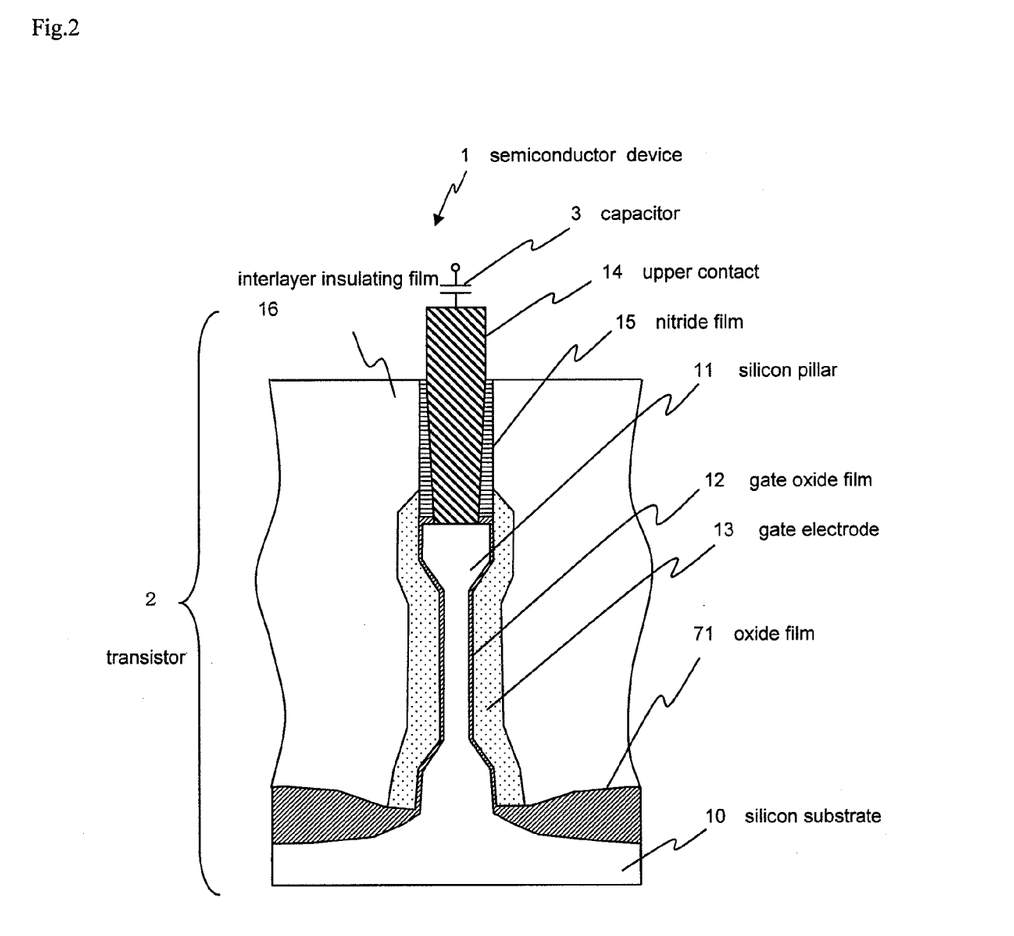
FIG. 2 is a sectional view showing the structure of an essential portion of a semiconductor device in an exemplary embodiment.

A semiconductor device in a first embodiment is a semiconductor memory which includes a capacitor and a transistor which are disposed and which are in a superposed condition and connected to each other in series. FIG. 2 is a sectional view showing the structure of a main portion of the semiconductor device in the exemplary embodiment.

Semiconductor device 1 of the exemplary embodiment has, as shown in FIG. 2, transistor 2 and capacitor 3 disposed by being superposed on transistor 2 and connected to transistor 2 in series. In transistor 2, when a voltage is applied to gate electrode 13, a channel is produced in silicon pillar 11, and a longitudinal current path is formed from silicon pillar 11 to capacitor 3 through upper contact 14. A method of manufacturing transistor 2 will be described below in detail.

Figure 3:
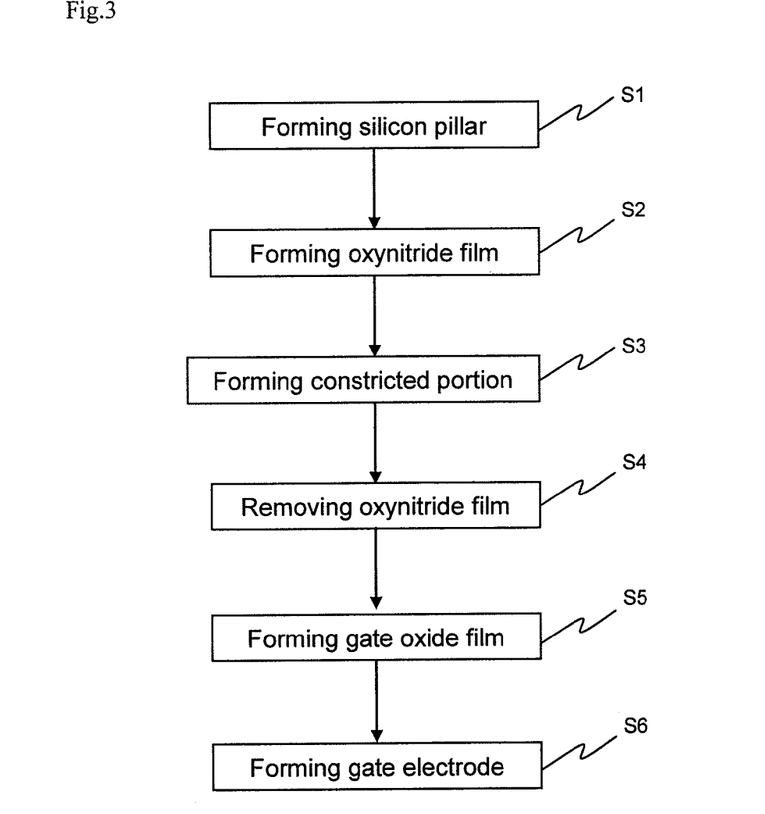
FIG. 3 is a process diagram showing the flow of a process of manufacturing the transistor in the exemplary embodiment.

FIG. 3 is a process diagram showing the flow of a process of manufacturing transistor 2.

Figure 4:
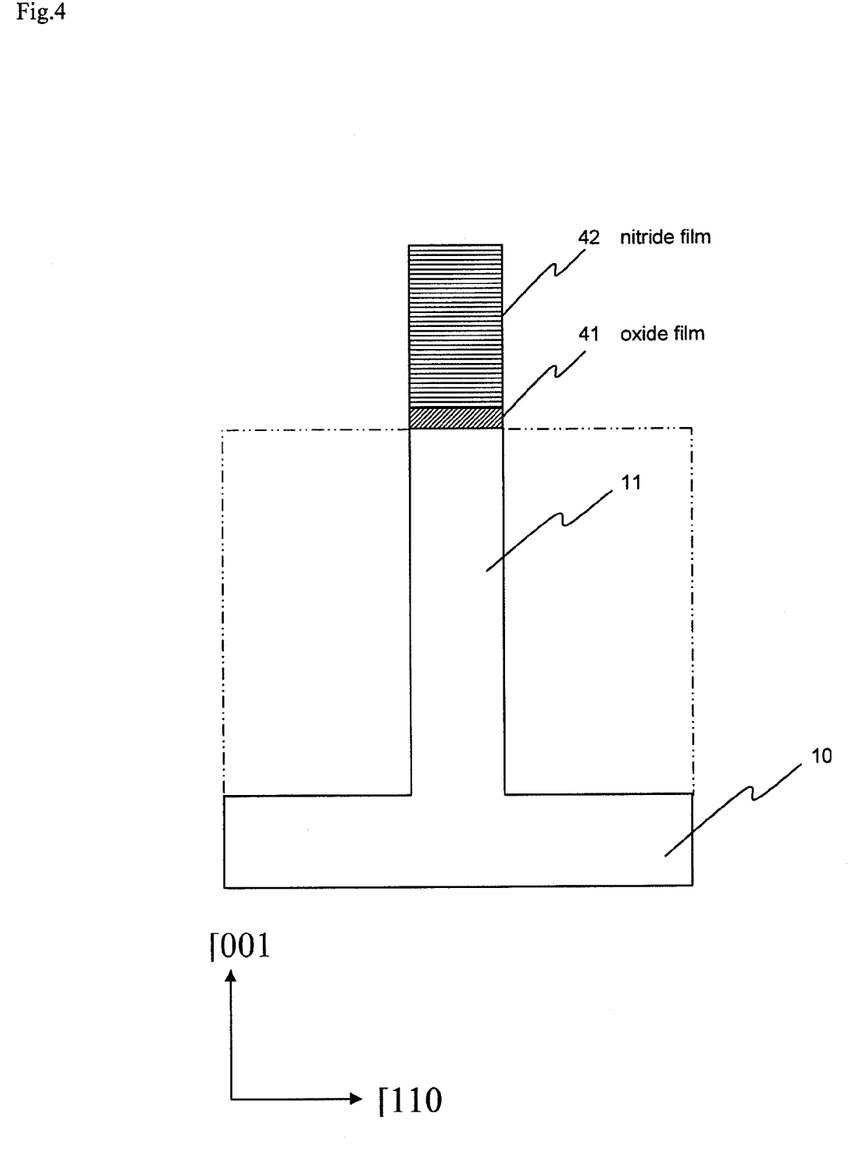
FIG. 4 is a sectional view for explaining a step of forming a silicon pillar in the process of manufacturing the transistor in the exemplary embodiment.

First, a step S1 of forming silicon pillar 11 will be described with reference to FIG. 4. As shown in FIG. 4, oxide film 41 and nitride film 42 are formed on a portion of silicon substrate 10, and anisotropic etching is performed by using nitride film 42 as a mask, thereby forming silicon pillar 11. In FIG. 4, [110] and [001] indicate plane directions of silicon crystal along coordinate axes shown in FIG. 4. Thus, in the present exemplary embodiment, silicon pillar 11 is formed along the [001] direction. It is assumed that, in the present exemplary embodiment, silicon pillar 11 is formed by using a circular mask having a diameter equal to a minimum feature size F (nm).

Figure 5:
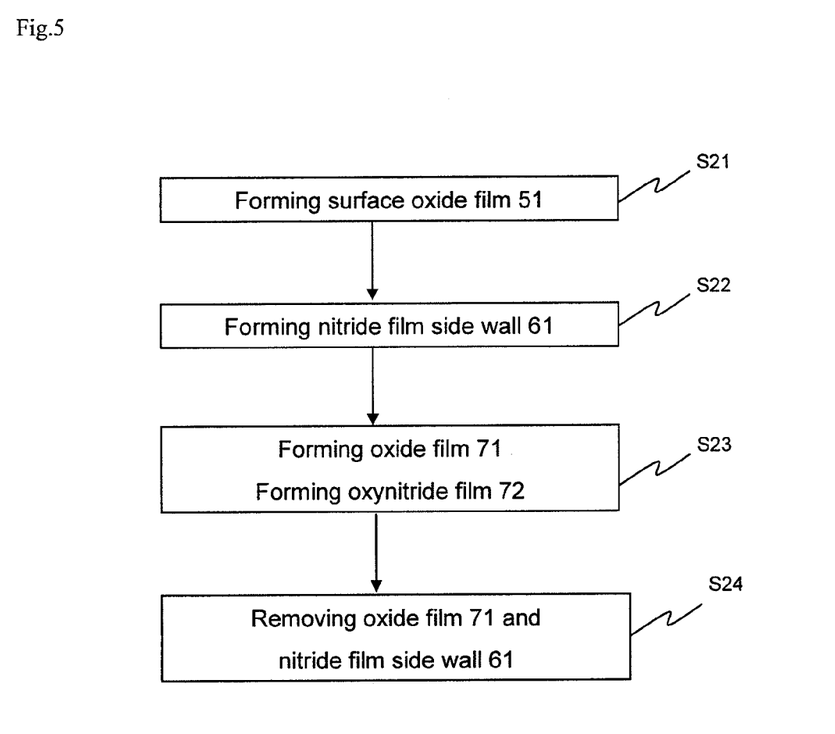
FIG. 5 is a process diagram showing the flow of a process of forming an oxynitride film in the process of manufacturing the transistor in the exemplary embodiment.

After step S1, step S2 of forming an oxynitride film (protective film) covering an upper end portion and a lower end portion of silicon pillar 11 is performed, as shown in FIG. 3. This step will be described with reference to FIGS. 5 to 9. This step is constituted of four steps, as shown in FIG. 5. Each of these steps will be described below.

Figure 6:
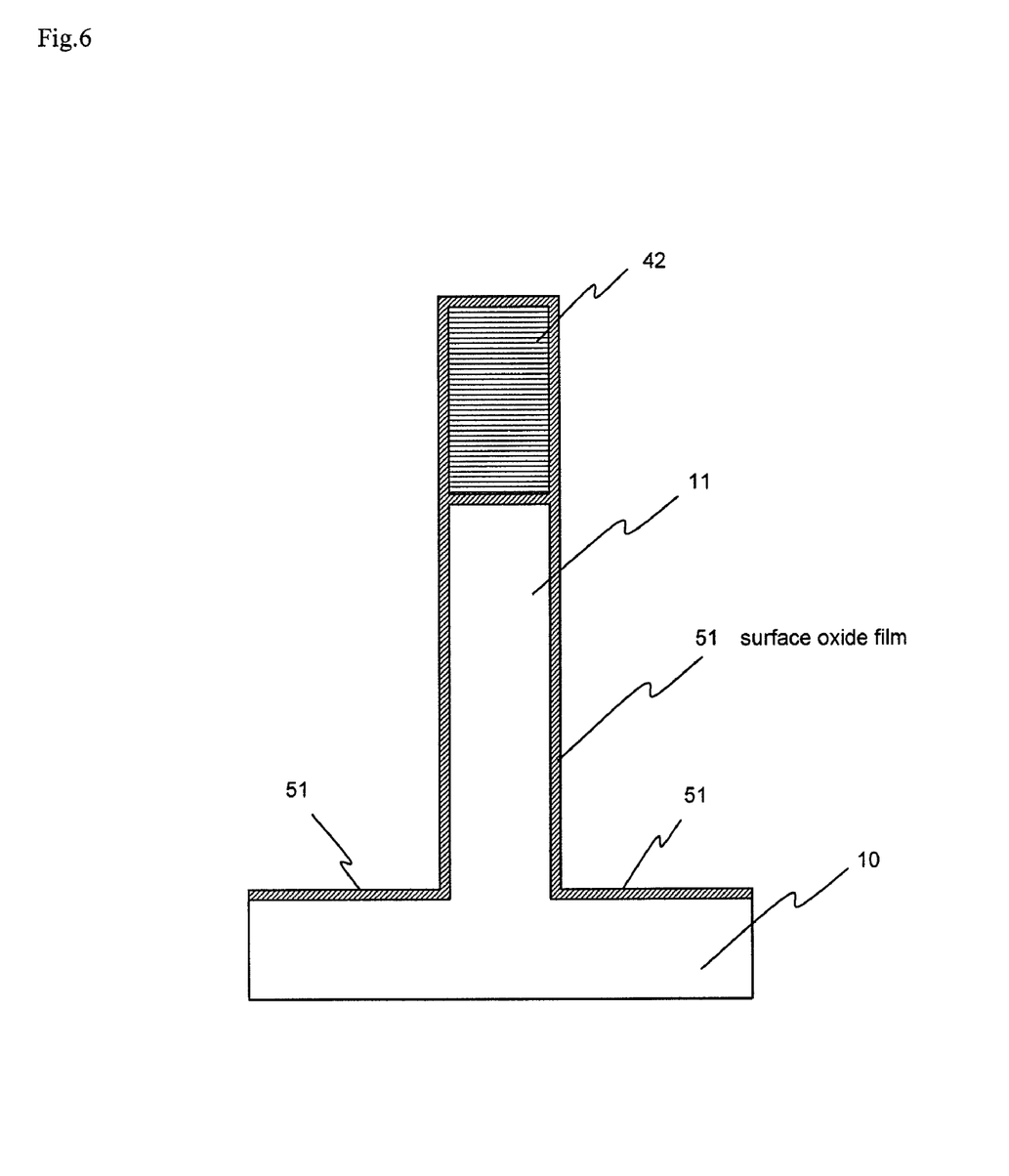
FIG. 6 is a sectional view for explaining a step of forming a surface oxide film in the process of manufacturing the transistor in the exemplary embodiment.

First, as shown in FIG. 5, step 21 of forming surface oxide film 51 (first film) is performed. In this step, as shown in FIG. 6, surface oxide film 51 is formed so as to cover the upper surface of silicon substrate 10, the side surface of silicon pillar 11 and the surface of nitride film 42.

Figure 7:
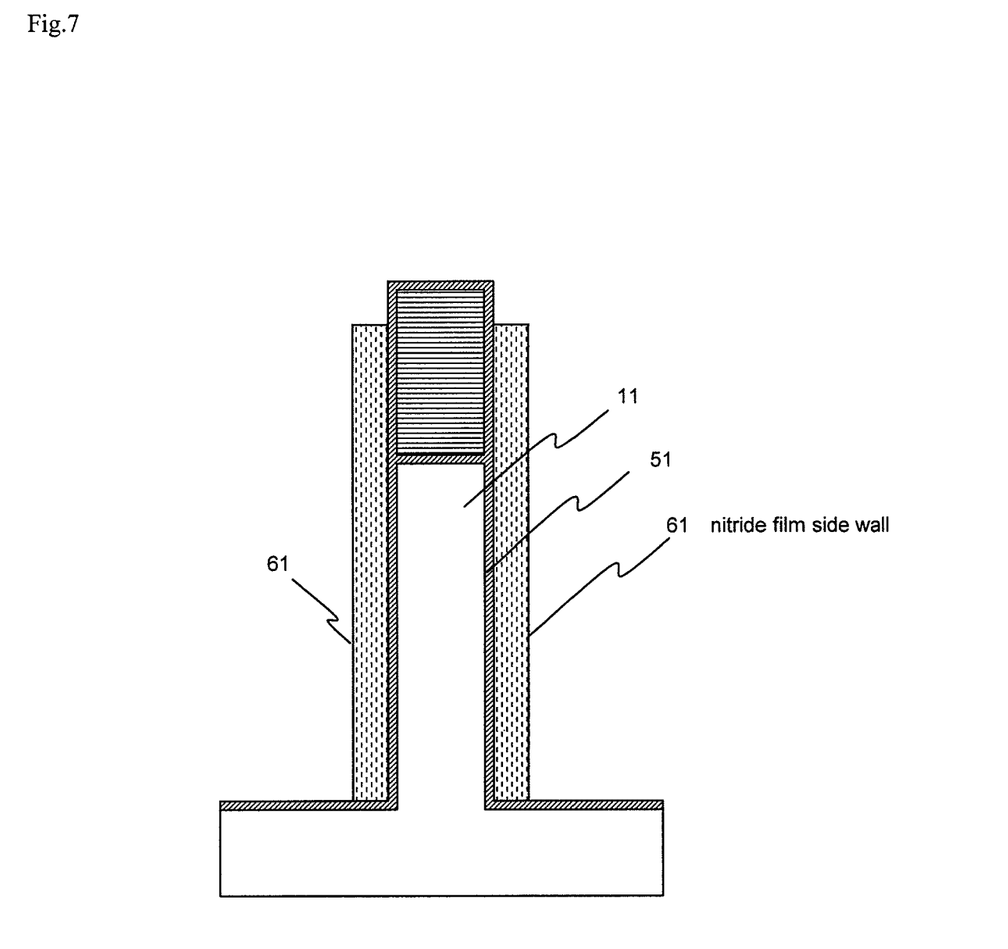
FIG. 7 is a sectional view for explaining a step of forming a nitride film side wall in the process of manufacturing the transistor in the exemplary embodiment.

After step S21, step 22 of forming nitride film side wall 61 (second film) is performed, as shown in FIG. 5. In this step, as shown in FIG. 7, nitride film side wall 61 is formed so as to cover the side surface of silicon pillar 11 covered with surface oxide film 51. In the present exemplary embodiment, nitride film side wall 61 is formed in a self-alignment manner by etching back the nitride film.

Figure 8:
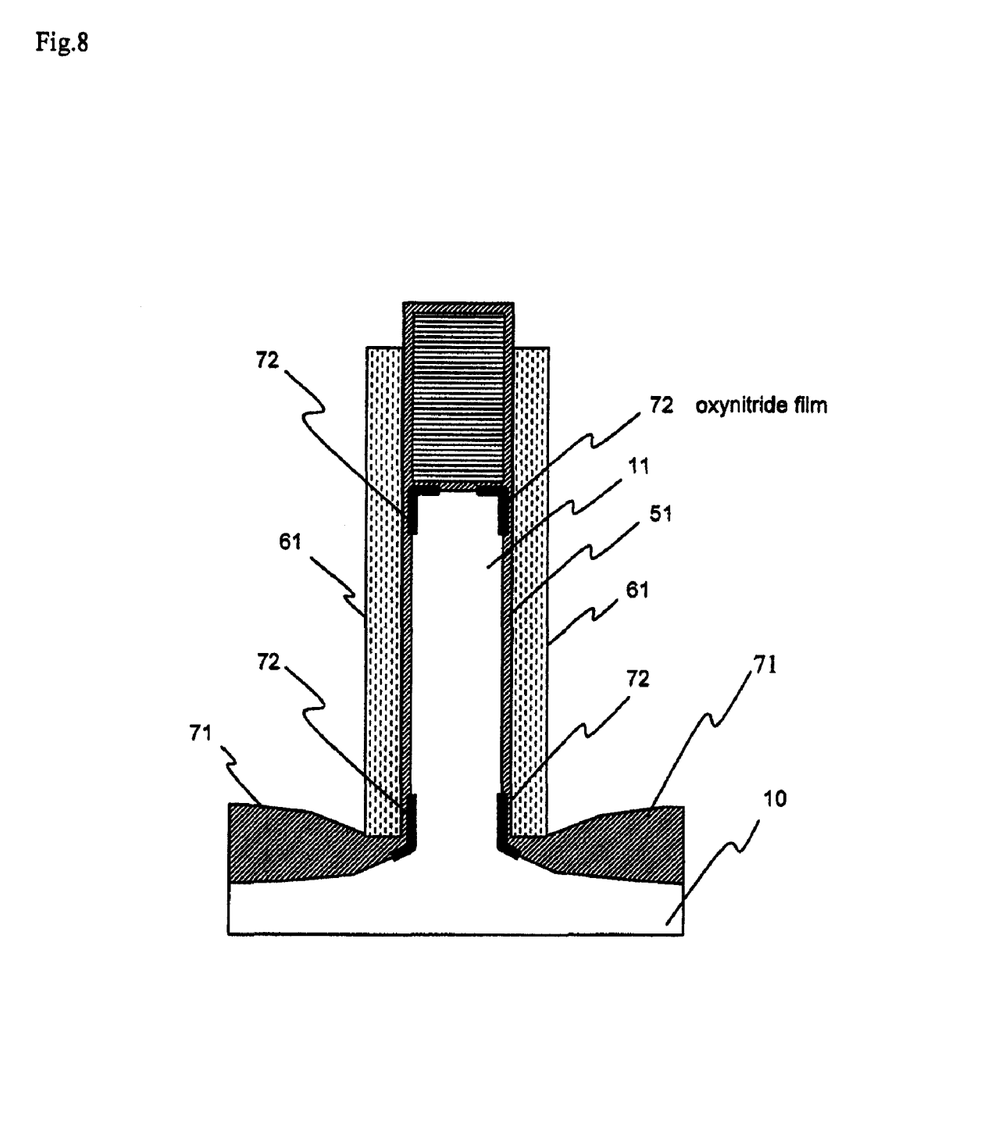
FIG. 8 is a sectional view for explaining a step of producing an oxynitride film by forming an oxide film in the process of manufacturing the transistor in the exemplary embodiment.

After step S22, step 23 of forming oxide film 71 (third film) to produce oxynitride film 72 is performed, as shown in FIG. 5. In this step, as shown in FIG. 8, oxide film 71 is formed on portions of silicon substrate 10 covered with surface oxide film 51, by selective oxidation using nitride film side wall 61 as a mask. During the forming of oxide film 71 (during oxidation), the oxidized species are diffused in surface oxide film 51 at an upper end portion and a lower end portion of the side surface of silicon pillar 11 to slightly oxidate nitride film side wall 61, thereby producing a nitride compound. This nitride compound is diffused in surface oxide film 51 to react with silicon at the interface between silicon pillar 11 and surface oxide film 51, thereby forming oxynitride film 72, as shown in FIG. 8.

Figure 9:
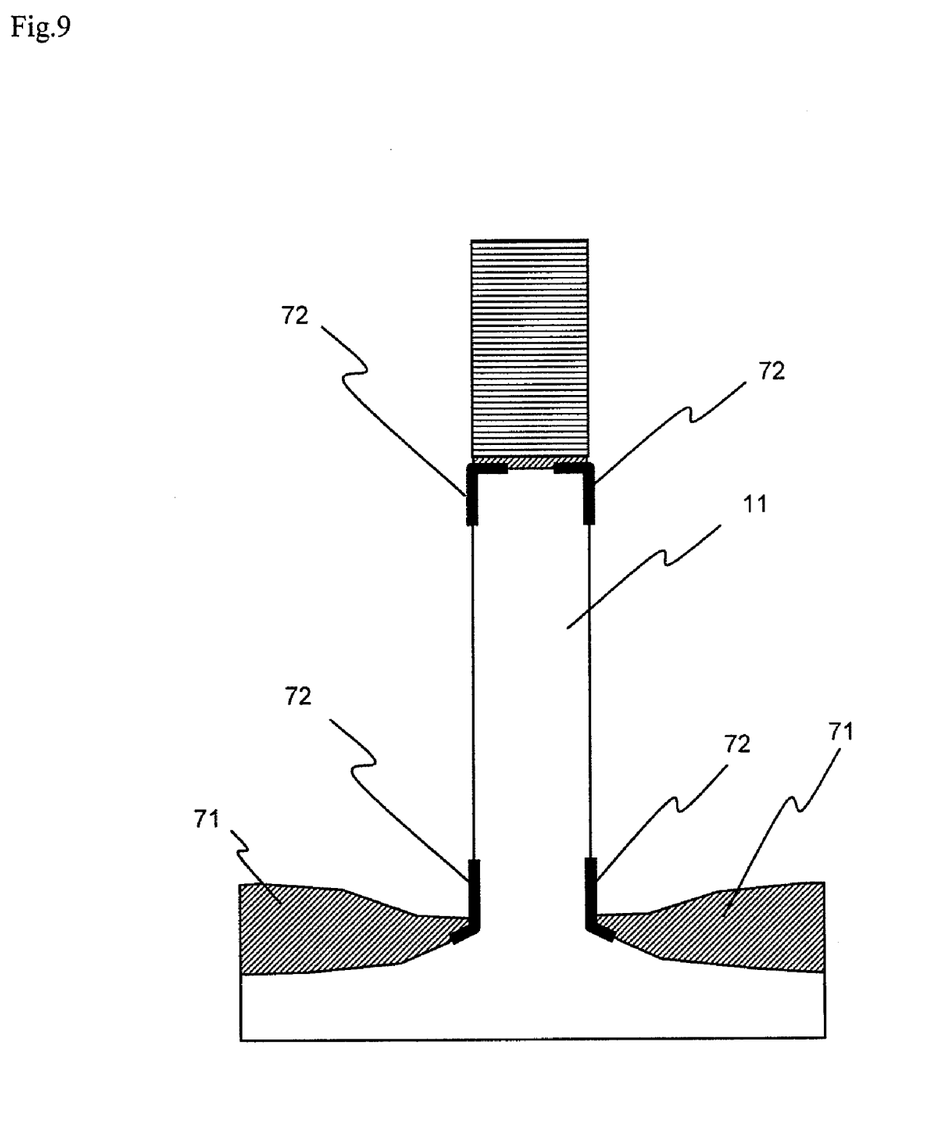
FIG. 9 is a sectional view for explaining a step of exposing the oxynitride film by removing the nitride film side wall and the surface oxide film in the process of manufacturing the transistor in the exemplary embodiment.

After step S23, step 24 of exposing oxynitride film 72 by removing nitride film side wall 61 and surface oxide film 51 is performed, as shown in FIG. 5. In this step, as shown in FIG. 9, nitride film side wall 61 and surface oxide film 51 which are formed on the side surface of silicon pillar 11 are removed by wet etching. However, oxynitride film 72 is not removed. As a result, the upper end portion and the lower end portion of the side surface of silicon pillar 11 are protected with oxynitride film 72. Step S2 is thereby completed. In step S24, since surface oxide film 51 is smaller in thickness than oxide film 71, only surface oxide film 51 is removed by controlling the time during which wet etching is performed.

Figure 10:
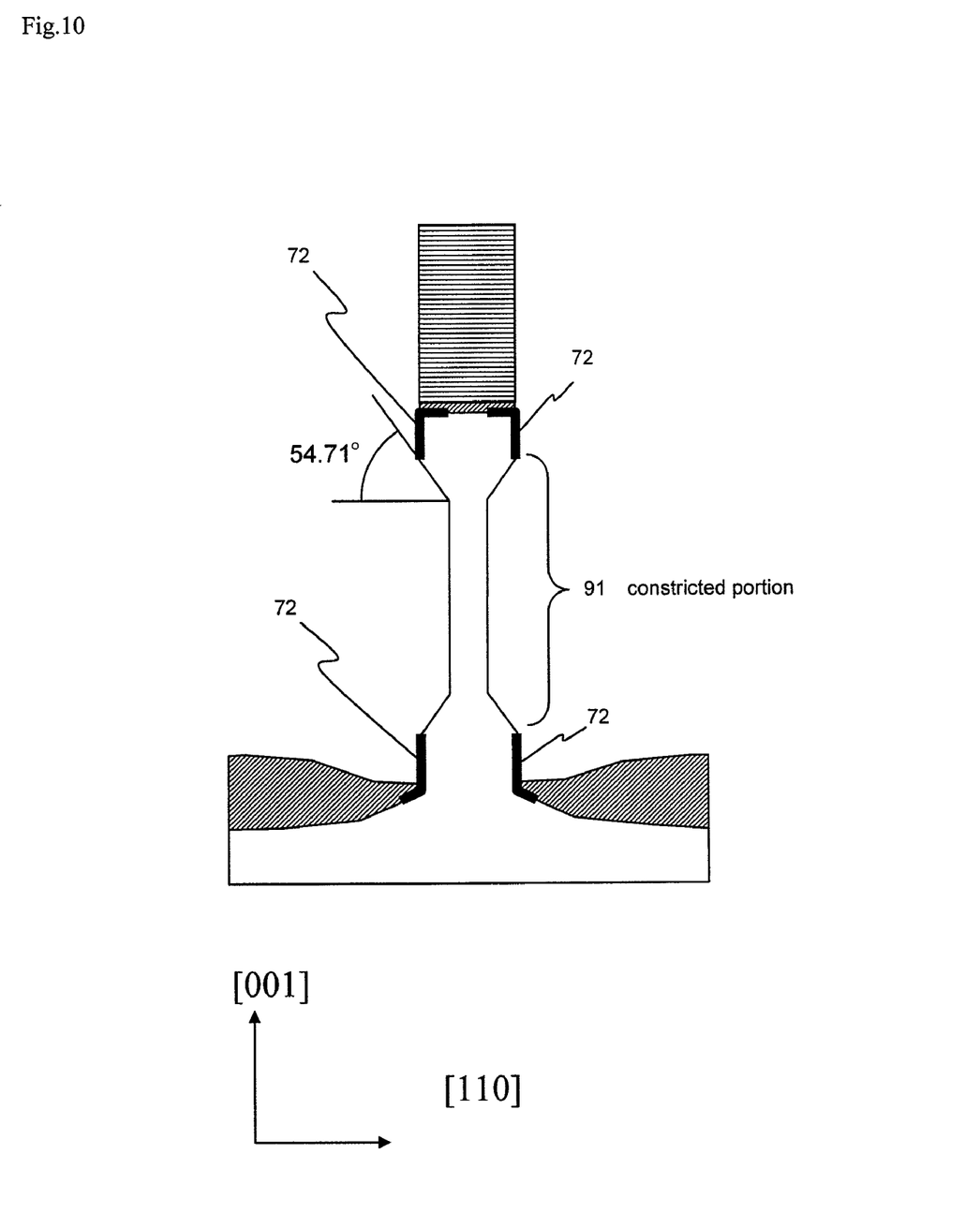
FIG. 10 is a sectional view for explaining a step of forming a constricted portion in the process of manufacturing the transistor in the exemplary embodiment.

After step S2, step 3 of forming a constriction in a central portion of the side surface of silicon pillar 11 not covered with oxynitride film 72 is performed, as shown in FIG. 3. In this step, anisotropic etching using a chemical solution such as potassium hydroxide or tetramethylammonium hydroxide with a lower rate of etching on a Si{111} plane is performed. A constricted portion 91 having a gradient at an angle of 54.71° is thereby formed in the central portion of the side surface of silicon pillar 11, as shown in FIG. 10.

Figure 11:
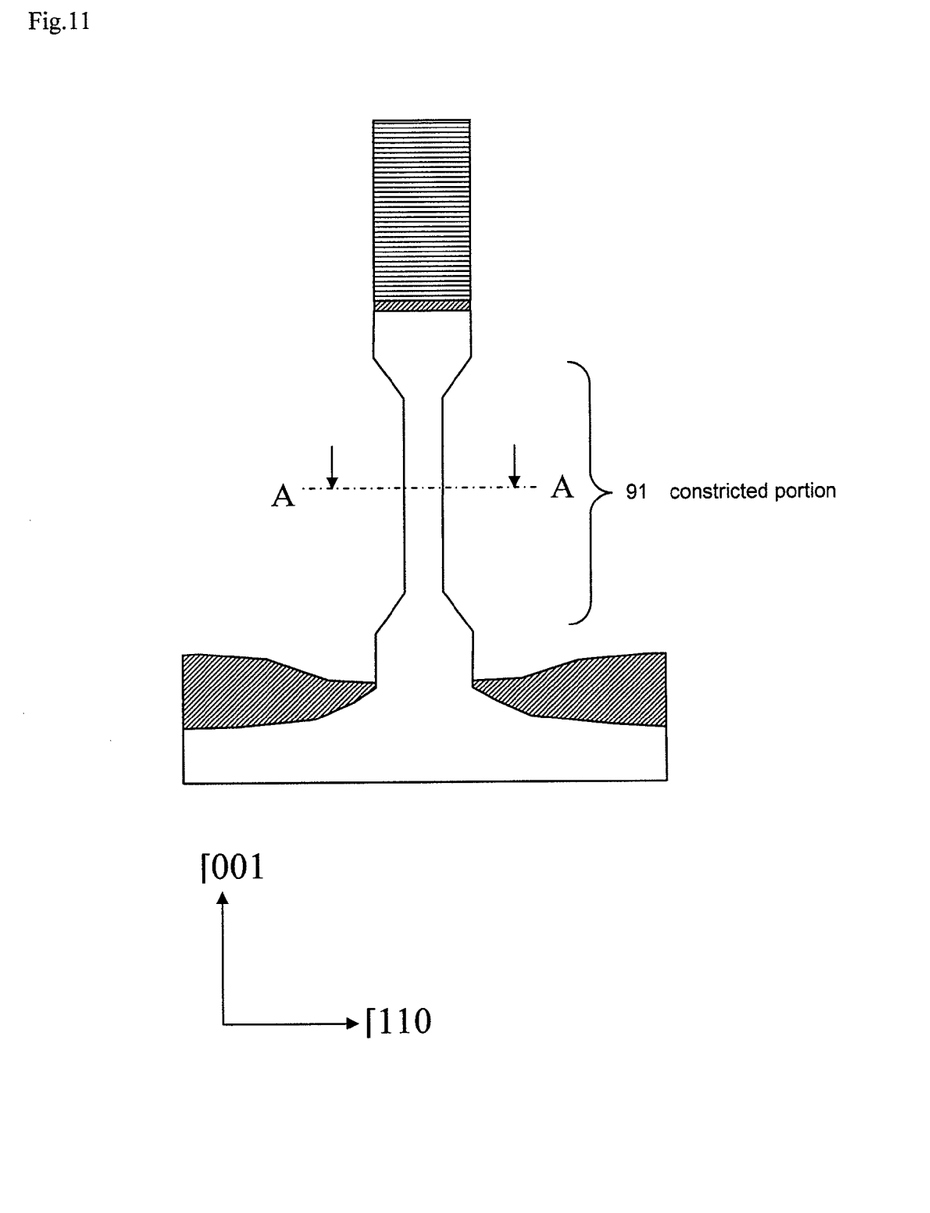
FIG. 11 is a sectional view for explaining a step of removing the oxynitride film in the process of manufacturing the transistor in the exemplary embodiment.
Figure 12:
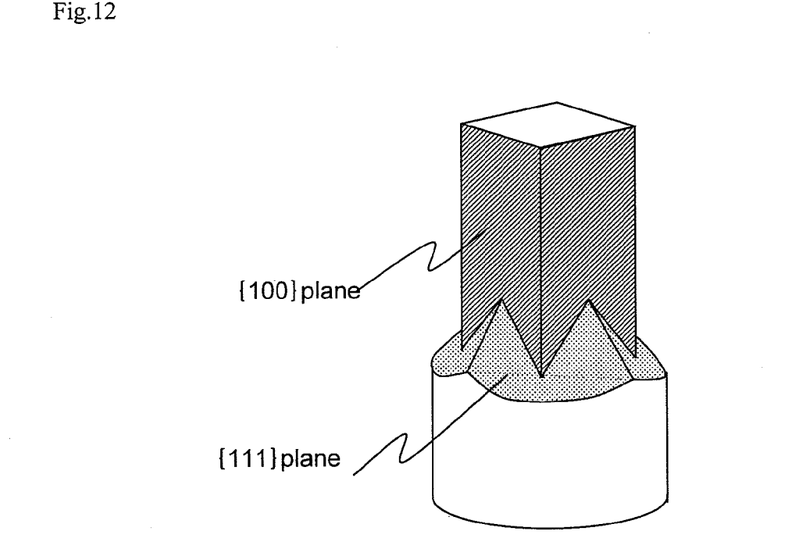
FIG. 12 is a perspective view showing a section cut along a line A-A shown in FIG. 10.
Figure 13:
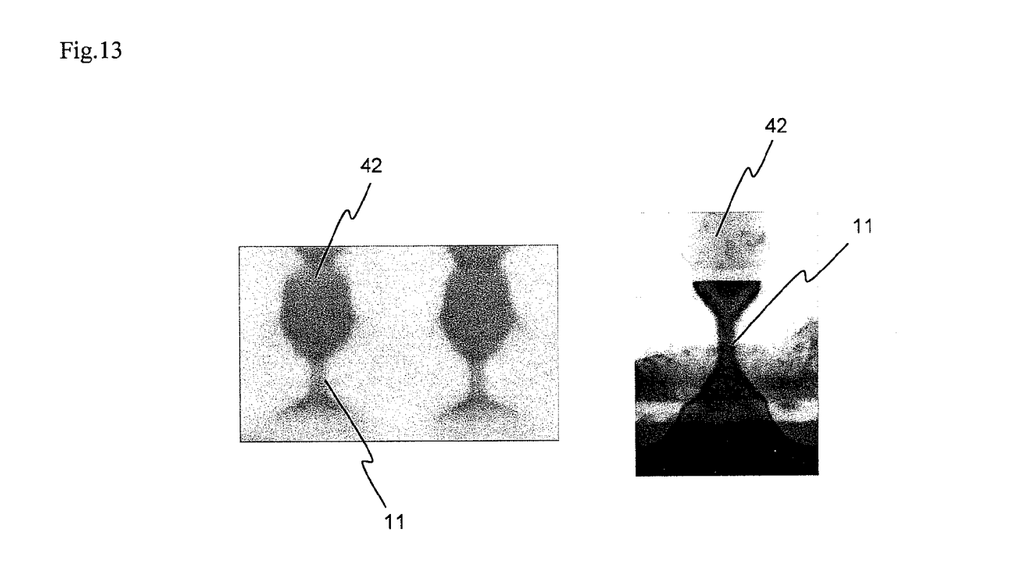
FIG. 13 is an image showing an actual condition after removing the oxynitride film.

After step S3, step 4 of removing oxynitride film 72 is performed, as shown in FIG. 3. In this step, oxynitride film 72 is removed from the upper end portion and the lower end portion of the side surface of silicon pillar 11 (the side surface of silicon pillar 11 is exposed) by performing sacrificial oxidation, as shown in FIG. 11. FIG. 12 is a perspective view showing a section cut along line A-A shown in FIG. 11. FIG. 13 is an image showing an actual condition after removing oxynitride film 72.

Figure 14:
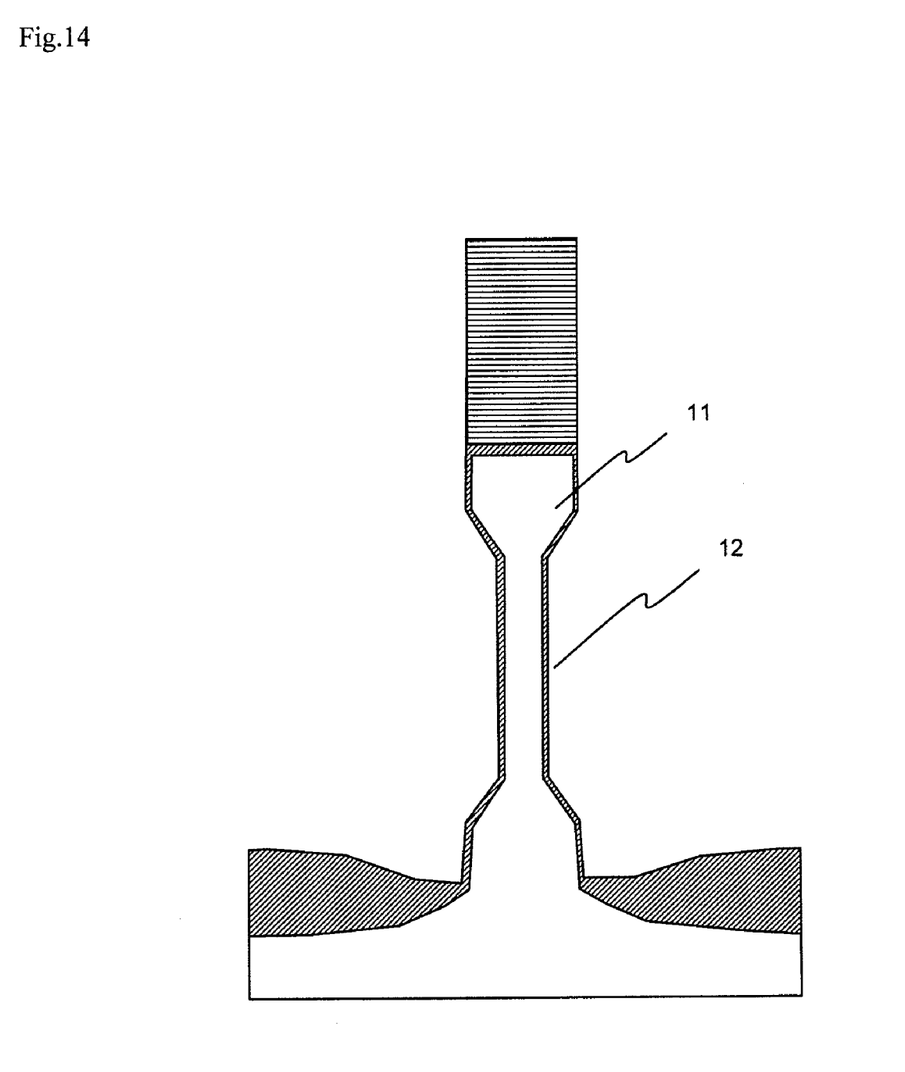
FIG. 14 is a sectional view for explaining a step of forming a gate oxide film in the process of manufacturing the transistor in the exemplary embodiment.

Since constricted portion 91 is formed by anisotropic etching using the above-described chemical solution, a Si{100} plane is dominant in the side surface of silicon pillar 11, as shown in FIG. 12. That is, the Si{100} plane occupies most of the surface area of the side surface of silicon pillar 11. Constricted portion 91 is formed so that its width is ½ to ⅓ of the width of the upper portion of silicon pillar 11 and its height is 100 nm or less. After step S4, step 5 of forming gate oxide film 12 is performed, as shown in FIG. 3. Gate oxide film 12 is formed so as to cover the side surface of silicon pillar 11, as shown in FIG. 14.

Figure 15:
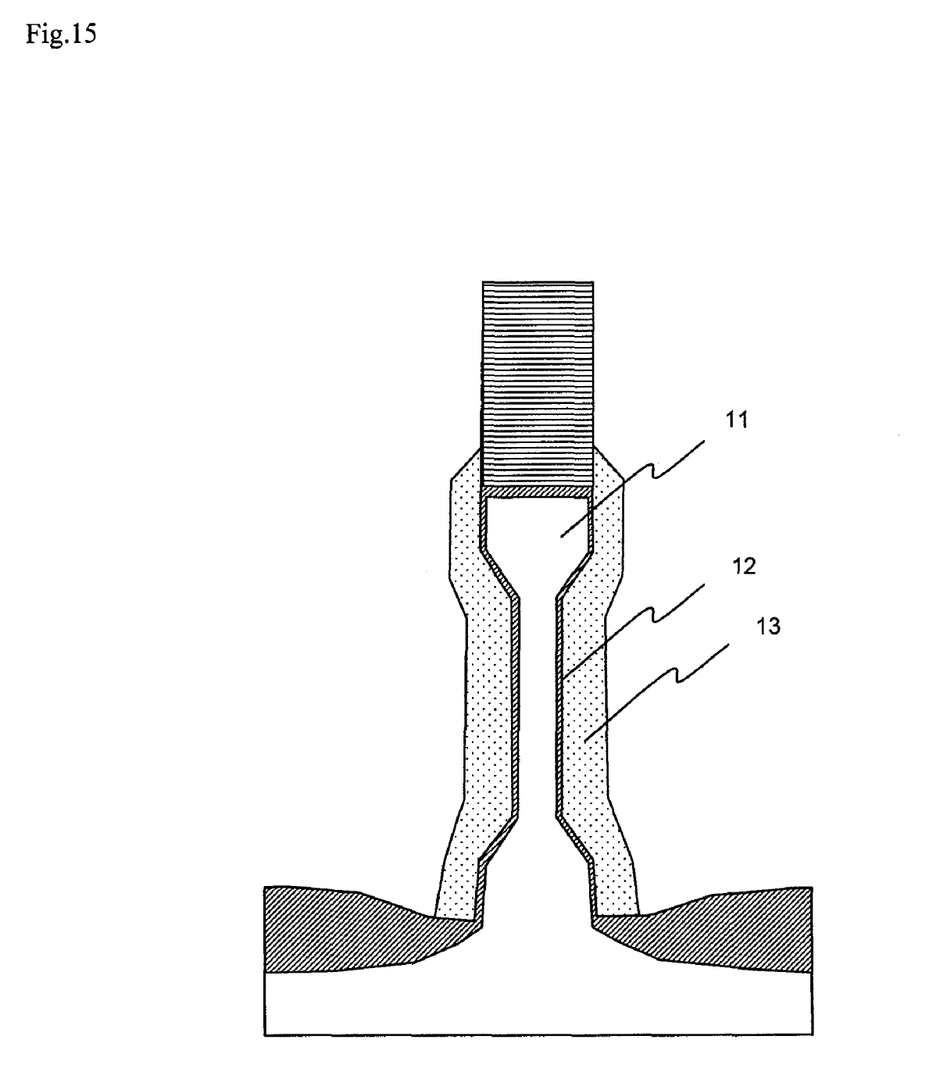
FIG. 15 is a sectional view for explaining a step of forming a gate electrode in the process of manufacturing the transistor in the exemplary embodiment.

After step S5, step 6 of forming gate electrode 13 is performed, as shown in FIG. 3. Gate electrode 13 is formed so as to cover gate oxide film 12, as shown in FIG. 15. Thereafter, interlayer insulating film 16 is embedded and oxide film 41 and nitride film 42 are removed, as shown in FIG. 2. Also, upper contact 14 corresponding to a drain or a source is formed on the upper surface of silicon pillar 11, and nitride film 15 for insulation between gate electrode 13 and upper contact 14 is formed. In the present exemplary embodiment, a side wall spacer necessary for separation (insulation) between upper contact 14 and gate electrode 13 is set to 5 (nm). Accordingly, the area of contact between silicon pillar 11 and upper contact 14 (the sectional area of an upper portion of silicon pillar 11) is specified by $(F-10) \times \pi$ (nm$^2$). Also, in the present exemplary embodiment, the side surface of a tapered portion on which a source or a drain is formed (a lower portion of silicon pillar 11) is a Si{111} plane. Ordinarily, the oxidation rate increases in the order of Si{100} plane, Si{110} plane and Si{111} plane. Therefore, the oxide film on the side surface of the tapered portion can be increased relative to that on the side surface of the portion of silicon pillar 11 in which the channel is formed. As a result, the reliability of the separation between the gate and the source or between the gate and the drain can be increased.

In the present exemplary embodiment, the silicon pillar is made thin by forming the constricted portion. The constricted portion is formed by performing anisotropic etching on the side surface of the silicon pillar. In the side surface of the silicon pillar, therefore, a particular crystal plane is exposed largely in comparison with other crystal planes (the particular crystal plane is dominant). Limiting of variation in film thickness at the time of forming the gate oxide film is thereby facilitated. Thus, the silicon pillar can be made thin without impairing the uniformity of the characteristics of the transistor.

It is apparent that the present invention is not limited to the above embodiment, but may be modified and changed without departing from the scope and spirit of the invention.

What is claimed is:

1. A method of manufacturing a semiconductor device, comprising:
    forming a silicon pillar on a substrate;
    forming a protective film which covers an upper end portion and a lower end portion of a side surface of the silicon pillar;
    forming a constricted portion by anisotropic etching in a portion of the side surface of the silicon pillar which is not covered with the protective film, after forming the protective film;
    removing the protective film after forming the constricted portion;
    forming a gate oxide film which covers the side surface of the silicon pillar in which the constricted portion is formed, after removing the protective film; and
    forming a gate electrode which covers the gate oxide film.

2. The method according to claim 1, wherein forming of the protective film comprises:
    forming a first film which covers an upper surface of the substrate and the side surface of the silicon pillar;
    forming a second film which covers the side surface of the silicon pillar which is covered with the first film;
    forming a third film which covers the portion of the substrate which is covered with the first film after forming the second film to produce the protective film at the interface between the first film and the upper end portion of the side surface of the silicon pillar, and at the interface between the first film and the lower end portion of the side surface of the silicon pillar; and
    removing the first film and the second film to expose the protective film.

3. The method according to claim 2, wherein the first film and the third film are oxide films and the second film is a nitride film.

\* \* \* \* \*